United States Patent [19]
Shiraishi et al.

[11] 3,905,844
[45] Sept. 16, 1975

[54] METHOD OF MAKING A PN JUNCTION DEVICE BY METAL DOT ALLOYING AND RECRYSTALLIZATION

[75] Inventors: Tadashi Shiraishi, Yamatokoriyama; Tadashi Yamanaka, Osaka, both of Japan

[73] Assignee: Matsushita Electric Industrial Co., Ltd., Kadoma, Japan

[22] Filed: June 25, 1973

[21] Appl. No.: 373,294

Related U.S. Application Data

[62] Division of Ser. No. 261,332, June 9, 1972, abandoned.

[30] Foreign Application Priority Data

| | | |
|---|---|---|
| June 15, 1971 | Japan | 46-43067 |
| Aug. 9, 1971 | Japan | 46-46068 |
| Aug. 9, 1971 | Japan | 46-60525 |
| Aug. 9, 1971 | Japan | 46-60531 |

[52] U.S. Cl. ................ 148/177; 148/175; 148/176; 148/178; 357/16
[51] Int. Cl.[2] ........................ H01L 7/36; H01L 7/46
[58] Field of Search ........... 148/177, 175, 178, 179, 148/176; 317/234 Q; 357/16

[56] References Cited

UNITED STATES PATENTS

| | | | |
|---|---|---|---|
| 2,903,628 | 9/1959 | Giacoletto | 317/234 |
| 3,009,841 | 11/1961 | Faust | 148/179 |
| 3,232,800 | 2/1966 | Mihara et al. | 148/179 |
| 3,309,244 | 3/1967 | Ackerman et al. | 148/178 |
| 3,416,979 | 12/1968 | Onuma et al. | 148/178 |
| 3,434,017 | 3/1969 | Schlosshauer et al. | 317/234 |
| 3,510,368 | 5/1970 | Hahn | 148/175 |
| 3,634,151 | 1/1972 | Sato et al. | 148/178 |

*Primary Examiner*—Walter R. Satterfield
*Attorney, Agent, or Firm*—Wenderoth, Lind & Ponack

[57] ABSTRACT

A method of making a PN junction device comprising the steps of alloying a metal dot to a semiconductor wafer so as to provide a recrystallization portion, extending the recrystallization portion through the semiconductor wafer, and then providing a semiconductor material to one surface of the semiconductor wafer so as to form a PN junction.

8 Claims, 8 Drawing Figures

METHOD OF MAKING A PN JUNCTION DEVICE BY METAL DOT ALLOYING AND RECRYSTALLIZATION

This application is a division of our co-pending application Ser. No. 261,332 filed June 9, 1972 and now abandoned.

This invention relates to a PN junction device fabricated by an alloy or alloy diffusion method, and more particularly to a PN junction device having a high quality factor Q with a very thin semiconductor part. The invention also relates to the method of making the same.

There are various conventional kinds of PN junction devices fabricated by an alloy or alloy diffusion method. However, in such conventional PN junction devices, the semiconductor portion which is in series with the PN junction of the device is thick so that it is difficult to get a high value of the quality factor Q.

Therefore, an object of the present invention is to provide a novel and improved PN junction device which is fabricated by an alloy or alloy diffusion method and has high Q and a structure wherein a thin semiconductor portion is formed in series with the PN junction.

This object and other features of the invention will be apparent from the following detailed description taken together with the accompanying drawings, wherein.

Figures 1, 2, 3, 4:
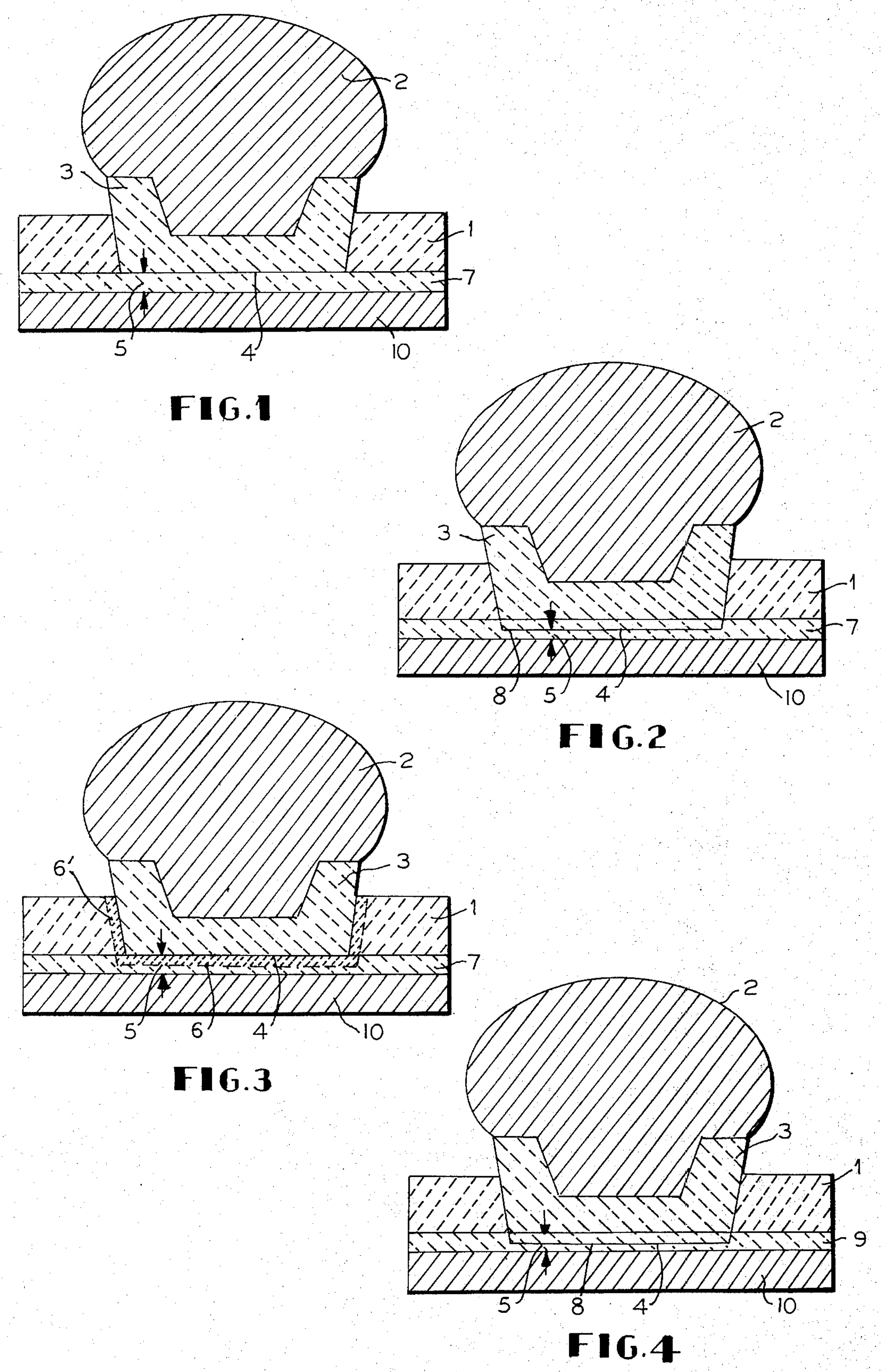
FIGS. 1–5 are cross-sectional views of embodiments of PN junction devices according to the present invention.
Figure 5:
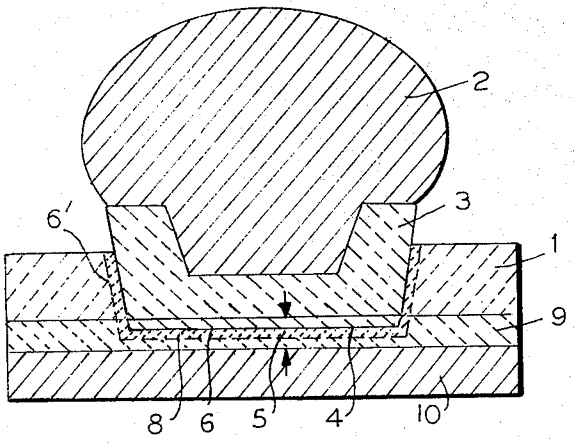

Now, referring to FIGS. 1–3, a PN junction device according to the invention comprises a wafer designated by reference numeral 1, which is made of a semiconductor material of one type of conductivity, a metal dot 2 which includes an N-type impurity and/or a P-type impurity, a recrystallization portion 3 extending into said wafer 1 and a semiconductor material in the form of an epitaxial growth layer 7 which is grown on said wafer 1. Said metal dot may further comprise a carrier metal when it is necessary. Said semiconductor layer 7 may be replaced by a semiconductor material in a form of a plate 9, as shown in FIGS. 4 and 5, which is joined to the recrystallization portion 3 and the wafer 1. Extension of said recrystallization portion 3 through the semiconductor wafer 1 is the feature of the present invention.

Figure 6:
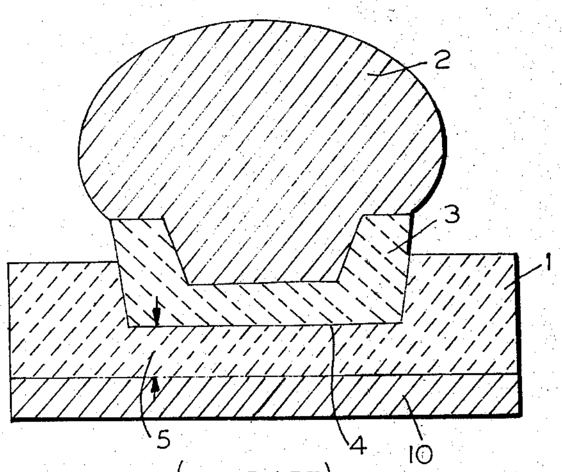
(PRIOR ART) FIG. 6
FIG. 6 is a cross-sectional view of an example of a conventional PN junction device fabricated by an alloy method, which is shown for comparison with the present invention.

Usually the quality factor Q of a PN junction device is expressed approximately by the following equation:

$$Q = \frac{1}{\omega C R_S}$$

where $\omega$ is an angular frequency of a signal applied to the PN junction device, and $C$ and $R_S$ are the junction capacitance and the series resistance of the device, respectively. The value of $R_S$ is nearly equal to a resistance of the part 5 of the semiconductor wafer 1 of a conventional device, as shown in FIG. 6 which remains after completion of the device. In order to increase $Q$, it is desirable to reduce the thickness of said part 5. However, it is very difficult to control the depth dimension of the recrystallization portion 3 because conditions for melting a semiconductor and metal depend upon several uncontrollable factors, such as the dislocation density of the semiconductor, cleanliness of the surface of the semiconductor material, etc.

In making conventional PN junction devices, in many cases while reducing the thickness of said part 5, the recrystallization portion 3 extends through the semiconductor wafer 1. Usually, the metal dot 2 is used as one electrode of the PN junction device, and for the other electrode 10 there is used a metal or a semiconductor wafer or layer having low resistivity which is connected to the wafer 1 having the remaining part 5 by a well-known method such as alloying or vapor deposition. Therefore, when the recrystallization layer 3 extends through the semiconductor wafer 1, there is caused a fatal defect that because no PN junction exists between the two electrodes, the two electrodes are short-circuited.

Figure 7:
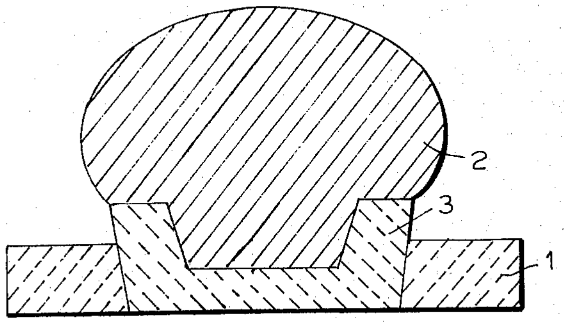
FIGS. 7 and 8 are cross-sectional views of a PN junction device during the fabricating process, according to the present invention.
Figure 8:
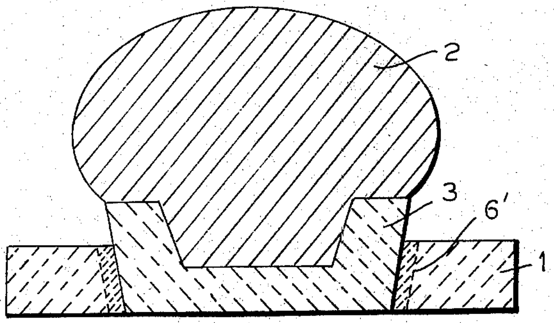

However, in the present invention, as shown in FIGS. 7 and 8, the recrystallization portion is purposely caused to extend through the semiconductor wafer 1. Then, a semiconductor layer 7 is grown, as shown in FIGS. 1 and 2, on the exposed surface of the recrystallization portion 3, or another semiconductor plate 9 is joined, as shown in FIGS. 4 and 5, to the semiconductor wafer 1 by extending the recrystallization portion 3 into that semiconductor plate 9, or by a kind of alloying.

In the structure of the PN junction device according to the invention, the grown semiconductor layer 7 has a conductivity of a different type from that of the recrystallization portion 3 so as to produce a PN junction 4 between the wafer and the layer. The thickness of the grown semiconductor layer can be easily controlled, for example to as small as 1$\mu$ by an epitaxial growth method, which is well known.

Referring to FIG. 4, the semiconductor plate 9, which is joined to the semiconductor wafer 1, has a conductivity of a different type from that of the recrystallization portion 3. The thickness of the extended part 8 of the recrystallization portion can be easily kept by causing the recrystallization portion 3 to extend into plate 9 at a temperature slightly higher than the temperature during alloying where the semiconductor wafer 1 and the metal dot 2 are melted and saturated. That is, at a temperature slightly higher than the temperature of the saturation state, the volume of the recrystallization portion increases slightly and so the recrystallization portion 3 extends into the semiconductor wafer 9 only a small amount, as shown by the extended part 8.

The semiconductor plate 9 applied to the wafer 1 can be very thin, especially when the plate 9 is grown on a semiconductor base 10 of a low resistivity which also acts as an electrode, and the depth of the extending part 8 can be kept small. Therefore, the remaining part 5 can be made limited to a very small thickness while at the same time preventing a short-circuit due to extension of the recrystallization portion completely through the semiconductor wafer 1.

Referring to FIG. 2, the recrystallization portion 3 is caused to extend into the semiconductor layer at the part 8 by a treatment at a temperature slightly higher than the temperature at the saturation state. As in the case of FIG. 4, the part 8 does not extend completely through the semiconductor layer 7 and so the thickness of the remaining part 5 can be kept very small.

If the recrystallization portion 3 does not extend through the semiconductor wafer 1, the recrystallization portion 3 is exposed, as shown in FIG. 7, by a well known method of chemical etching and/or mechanical abrasion.

Referring to FIGS. 3 and 5, an impurity contained in the metal dot 2 diffuses from the recrystallization portion 3 into the layer 7 (FIG. 3) or the plate 9 (FIG. 5) and the wafer 1, as shown by references 6 and 6', respectively. This is a so-called alloy-diffusion process, and as is well known, the depth of diffusion, i.e., the thickness of the diffusion layer 6, can be precisely controlled. Therefore, the thickness of the remaining part 5 can be made very small, as in the above case. FIG. 8 shows the penetration into the wafer 1 corresponding to FIGS. 3 and 5.

Illustrative embodiments of the PN junction device according to the present invention are described in the following examples with reference to FIGS. 1–5, 7 and 8.

EXAMPLE 1

Referring to FIG. 7, an aluminum dot 2 is alloyed to an N-type silicon wafer 1, which has a resistivity of 10 Ω-cm and is 110 μ thick at 1,100°C and a P-type recrystallization portion 3 extending completely through the silicon wafer 1 is formed. Then, an N-type silicon layer 7 having a resistivity of 1Ω-cm is grown thereon to a thickness of 3μ, as shown in FIG. 1, by a well-known epitaxial growth technique at a temperature slightly lower than the former temperature 1,100°C, for example at 1,080°C. The recrystallization portion 3 does not extend into the silicon layer 7. Therefore, the remaining part 5 of the silicon wafer has a small thickness of 3μ. Then, an aluminum layer 10 is deposited on the silicon layer 7 as an electrode. The aluminum dot 2 is used as the other electrode.

EXAMPLE 2

The PN junction device fabricated as described in Example 1 is heated at 1,106°C and then the recrystallization portion 3 extends into the silicon layer 7 to a depth of 1μ, as shown in FIG. 2. Accordingly, the thickness of the remaining part 5 is further reduced to 2μ. In this device, it is observed that a reverse current across the PN junction is smaller than that in the device of Example 1. It is considered that such reduction of the reverse current occurs because the silicon crystal at the PN junction site is in a more perfect state than that of Example 1.

EXAMPLE 3

Referring to FIG. 8, a metal dot 2 comprising tin, antimony and aluminum in a weight ratio of 100:10:0.2 is alloy diffused to a P-type silicon wafer 1, which has a resistivity of 3 Ω-cm and is 114 μ thick at 1,080°C, and an N-type recrystallization portion 3 is formed which extends through the silicon wafer 1. Because of the diffusion of aluminum, a diffusion layer 6' is also formed. Then, as shown in FIG. 3, a P-type silicon layer 7 having a resistivity of 3 Ω-cm and which is 4μ thick is grown thereon at a temperature slightly lower than the former temperature 1,080°C, for example at 1,070°C, by an epitaxial growth technique. Also, due to diffusion of aluminum at this time, a highly doped $P^+$-diffusion layer 6 is formed with a thickness of about 0.4μ. Diffusion of antimony is slight and negligible. Consequently, the formed PN junction has a structure of $N$—$P^+$—$P$, a so-called hyper abrupt junction. An aluminum electrode 10 is deposited on the silicon layer 7 by evaporation. The thickness of the remaining part 5 of the silicon layer 7 is 4μ. On the contrary, in a device fabricated by the conventional alloy-diffusion method, the thickness of the remaining part ranges from 20μ to 50μ. The thickness of the remaining part 5 can be further reduced by a heat treatment at a temperature slightly higher than 1,080° C, as described in Example 2.

EXAMPLE 4

An aluminum dot 2 is alloyed to an N-type silicon wafer 1, which has a resistivity of 1Ω-cm and is 98μ thick at 850°C and a P-type recrystallization portion 3 extending through the silicon wafer 1 is formed. An N-type silicon plate having a resistivity of 1Ω-cm and 30μ thick is placed in contact with the exposed recrystallization portion 3 and heated at 885°C. The recrystallization portion 3 extends into the silicon plate 9 at 8 to a depth of 6μ and the wafer and the plate are joined. This is a kind of alloying. On the silicon plate 9 a silicon and aluminum eutectic alloy wafer 30μ thick which acts as one electrode 10 is placed and heated at 650°C. This wafer eats into the silicon plate 9 to a depth of 11μ. Therefore, thickness of the remaining part 5 is 13μ. The cross-section of the resultant device is shown in FIG. 4.

EXAMPLE 5

A metal dot 2 comprising tin, antimony and aluminum in a weight ratio of 110:12:0.3 is alloy-diffused to a P-type silicon wafer 1 having a resistivity of 10 Ω-cm and 80μ thick at 1,000°C, and an N-type recrystallization portion 3 is formed extending through the silicon wafer. A P-type silicon plate 9 having a resistivity of 10 Ω-cm and 10μ thick is grown on a P-type silicon base 10, which acts as an electrode having a resistivity of 0.05 Ω-cm is placed in contact with the exposed recrystallization portion 3. Then it is heated at 1,030°C. The recrystallization portion 3 extends into the silicon plate 9 at 8 to a depth of 4μ, and a highly doped $P^+$diffusion layer 6 is formed by diffusion of aluminum. Diffusion of antimony is slight and negligible. Consequently, the formed PN junction has a structure of $N$—$P^+$—$P$, i.e. a so-called hyper abrupt junction, and the thickness of the remaining part 5 of about 6μ is provided. The cross-section of the resultant device is shown in FIG. 5.

In the above examples 1, 2 and 3, when the silicon layer is grown by the epitaxial growth technique, vapor from the metal dot sometimes causes a bad effect on the silicon layer, such as reduction of resistivity. In order to prevent such effects, it is effective to remove all or a part of the metal dot before the growth so as to diminish generation of the vapor. Such removal is also effective for diminution of amount of extention of the recrystallization portion. When all of the metal dot is removed, an electrode is applied to the site, where the metal dot exists, by a conventional method such as vapor deposition of metal.

What is claimed is:

1. A method of making a PN junction device comprising, in the following recited order, the steps of:

preparing a semiconductor wafer of one conductivity type having one outer surface and an opposite outer surface;

alloying, by heating, a metal dot into said semiconductor wafer from said one outer surface, the portion of said semiconductor wafer having said metal dot alloyed thereinto being a recrystallization portion of the opposite conductivity type, said heating being maintained so as to make said recrystallization portion penetrate from said one outer surface to said opposite outer surface completely through said wafer; and attaching a further semiconductor material of the same conductivity type as that of said semiconductor wafer to said opposite outer surface of said semiconductor wafer so as to form a PN junction, said further semiconductor material also being in contact with said recrystallization portion.

2. The method of claim 1 wherein said metal dot includes an impurity of the same conductivity type as that of said further semiconductor material, and a part of said impurity is diffused into said further semiconductor material, thereby forming a hyperabrupt PN junction.

3. The method of claim 1 wherein the region of said recrystallization portion contacting said further semiconductor material is extended into said further semiconductor material by heating said further semiconductor material at a temperature which is higher than the temperature for said alloying step.

4. The method of claim 1 wherein said attaching step is carried out by placing a plate to be said further semiconductor material in contact with said recrystallization portion and heating at a temperature which is higher than the temperature for said alloying step.

5. A method of making a PN junction device comprising, in the following recited order, the steps of:

preparing a semiconductor wafer of one conductivity type having one outer surface and an opposite outer surface;

alloying, by heating a metal dot into said semiconductor wafer from said one outer surface, the portion of said semiconductor wafer having said metal dot alloyed thereinto being a recrystallization portion of the opposite conductivity type;

removing from said opposite outer surface a portion of said semiconductor wafer so as to thin said semiconductor wafer in a manner that said recrystallization portion penetrates completely through from said one outer surface to the surface of the thus thinned semiconductor wafer opposite to said one outer surface; and then attaching a further semiconductor material of the same conductivity type as that of said semiconductor wafer to said surface of the thinned semiconductor wafer opposite to said one outer surface so as to form a PN junction, said further semiconductor material also being in contact with said recrystallization portion.

6. The method of claim 5 wherein said metal dot includes an impurity of the same conductivity type as that of said further semiconductor material, and a part of said impurity is diffused into said further semiconductor material, thereby forming a hyperabrupt PN junction.

7. The method of claim 5 wherein the region of said recrystallization portion contacting said further semiconductor material is extended into said further semiconductor material by heating said further semiconductor material at a temperature which is higher than the temperature for said alloying step.

8. The method of claim 5 wherein said further semiconductor material is attached to said opposite outer surface of said semiconductor wafer by placing a plate of said further semiconductor material in contact with said recrystallization portion and heating at a temperature which is higher than the temperature for said alloying.

* * * * *